(12) United States Patent
Mahajan et al.

(10) Patent No.: US 12,713,709 B2
(45) Date of Patent: Aug. 18, 2026

(54) ESD PROTECTION CIRCUIT

(71) Applicant: Renesas Design Netherlands B.V., 's-Hertogenbosch (NL)

(72) Inventors: Prantik Mahajan, Nijmegen (NL); Jan Otten, Nijmegen (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 294 days.

(21) Appl. No.: 18/508,776

(22) Filed: Nov. 14, 2023

(65) Prior Publication Data

US 2025/0160000 A1 May 15, 2025

(51) Int. Cl.
*H10D 89/60* (2025.01)

(52) U.S. Cl.
CPC ......... *H10D 89/713* (2025.01); *H10D 89/921* (2025.01)

(58) Field of Classification Search
CPC .......................... H10D 89/713; H10D 89/921
USPC .......................................................... 361/56
See application file for complete search history.

(56) References Cited

U.S. PATENT DOCUMENTS 7,027,278 B1 * 4/2006 Vashchenko ......... H10D 89/811 361/56
9,030,791 B2 * 5/2015 Prabhu .................. H02H 9/046 361/118
11,349,304 B2 5/2022 Loiseau et al.
2002/0097544 A1 * 7/2002 Vashchenko ........... H02H 9/046 361/111
2013/0128400 A1 * 5/2013 Yeh ........................ H02H 9/046 361/56
2018/0301898 A1 * 10/2018 Hsu ........................ H02H 9/046

OTHER PUBLICATIONS

Pan et al, "RC-Triggered Silicon Controlled Rectifier-based ESD Clamp with Fast Transient Reaction", Published in: 2023 China Semiconductor Technology International Conference (CSTIC), Date Added to IEEE Xplore: Aug. 22, 2023,DOI: 10.1109/CSTIC58779.2023.10219289 3 pages.

* cited by examiner

*Primary Examiner* — Yemane Mehari
(74) *Attorney, Agent, or Firm* — SCULLY, SCOTT, MURPHY & PRESSER, P.C.

(57) ABSTRACT

The present document describes an ESD protection circuit (100) which is configured to provide ESD protection between a first rail at an operating potential (111) and a second rail at a reference potential (112). The ESD protection circuit (100) comprises a detection unit (120) which is configured to detect an ESD event between the first rail and the second rail. Furthermore, the ESD protection circuit (100) comprises a clamp unit (130) configured to provide a discharge path between the first rail and the second rail, in reaction to an ESD event detected by the detection unit (120), wherein the clamp unit (130) comprises a main bipolar junction transistor (107) which is cascoded with an additional bipolar junction transistor (108, 308, 408) for providing the discharge path.

13 Claims, 4 Drawing Sheets

408
107
106
130
140
104
106
105
111
112
101
102
103
100
120

ESD PROTECTION CIRCUIT

TECHNICAL FIELD

The present document relates to an ESD (electrostatic discharge) protection circuit.

BACKGROUND

An integrated circuit may be exposed to electrostatic discharge. An ESD protection circuit may be used to protect the integrated circuit against the effects of an electrostatic discharge. The ESD protection circuit is typically configured to provide a temporary discharge path for dissipating the electrostatic charge, thereby protecting the integrated circuit.

The present document addresses the technical problem of providing a particularly area efficient and energy efficient ESD protection circuit with a low leakage current. The technical problem is solved by the independent claim. Preferred examples are described in the dependent claims.

SUMMARY

According to an aspect, an ESD protection circuit is described, which is configured to provide ESD protection between a first rail at an operating potential and a second rail at a reference potential. The ESD protection circuit comprises a detection unit which is configured to detect an ESD event between the first rail and the second rail. Furthermore, the ESD protection circuit comprises a clamp unit configured to provide a (temporary) discharge path between the first rail and the second rail, in reaction to an ESD event detected by the detection unit. The clamp unit comprises a main bipolar junction transistor which is cascoded with an additional bipolar junction transistor for providing the discharge path.

It should be noted that the systems including its preferred embodiments as outlined in the present document may be used stand-alone or in combination with the other systems disclosed in this document. In addition, the features outlined in the context of a system are also applicable to a corresponding method. Furthermore, all aspects of the systems outlined in the present document may be arbitrarily combined. In particular, the features of the claims may be combined with one another in an arbitrary manner.

BRIEF DESCRIPTION OF FIGURES

The invention is explained below in an exemplary manner with reference to the accompanying drawings, wherein.

DETAILED DESCRIPTION

Figure 1:
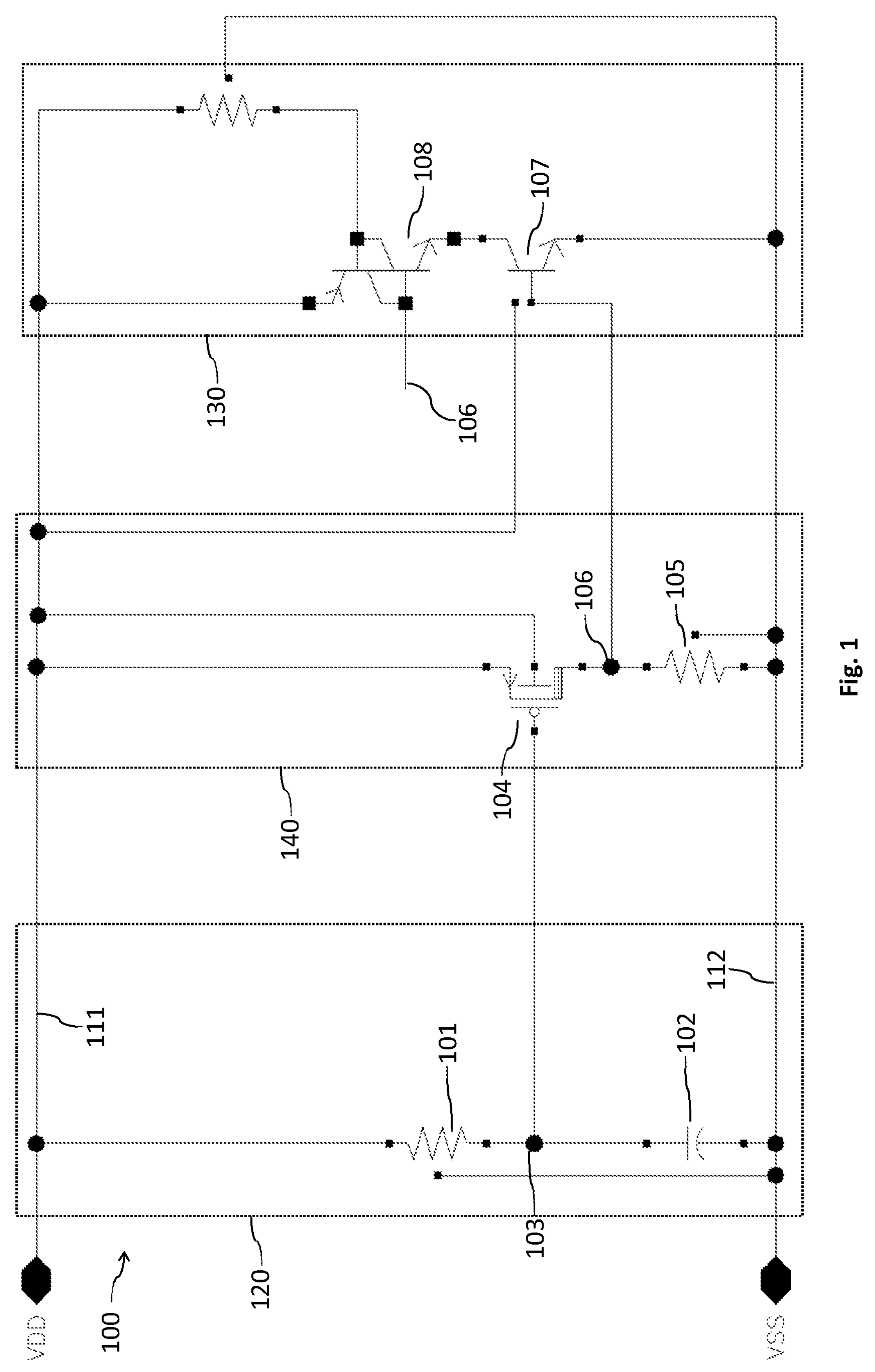
FIG. 1 shows an example ESD protection circuit.

As indicated above, the present document is directed at providing a particularly compact and efficient ESD protection circuit. FIGS. 1 to 4 show different examples of an ESD protection circuit 100 that can be implemented in an area efficient and energy efficient manner. The ESD protection circuit 100 is operated between (a first rail at) an operating potential VDD 111 and (a second rail at) a reference potential VSS 112. The first and/or second rail may be subjected to electrostatic discharge (ESD) which may lead to an abrupt increase of the voltage level of the first rail. The ESD protection circuit 100 comprises a detection unit 120 which is configured to detect an ESD event. The detection unit 120 may comprise a resistor 101 and a capacitor 102, which are arranged in series between the (first rail at the) operating potential 111 and (the second rail at) the reference potential 112. The voltage level of the detection node 103 may be indicative of an ESD event. The detection node 103 may be the midpoint between the resistor 101 and the capacitor 102.

The voltage level at the detection node 103 may be used to control a clamp unit 130 which is configured to clamp, in particular to limit, the operating potential 111 (i.e., the voltage level of the first rail) subject to an ESD event. The clamp unit 130 comprises a switching element, which is arranged between the (first rail at the) operating potential 111 and the (second rail at the) reference potential 112 and which is configured to provide a discharge path for the ESD charge from the operating potential 111 (i.e., from the first rail) to the reference potential 112 (i.e., to the second rail) when being closed. The ESD protection circuit 100 is typically designed such that the switching element of the clamp unit 130 is closed in reaction to the detection of an ESD event. On the other hand, the switching element is typically maintained open, when no ESD event has been detected. Hence, the discharge path may be provided temporarily for individual ESD events.

In the example illustrated in FIG. 1, the clamp unit 130 comprises a bipolar (npn) junction transistor (BJT) 107 as a switching element, wherein the use of a bipolar junction transistor 107 allows for a particular area efficient implementation of the clamp unit 130. The ESD protection may be provided by the snapback mechanism of the bipolar junction transistor 107.

Figure 3:
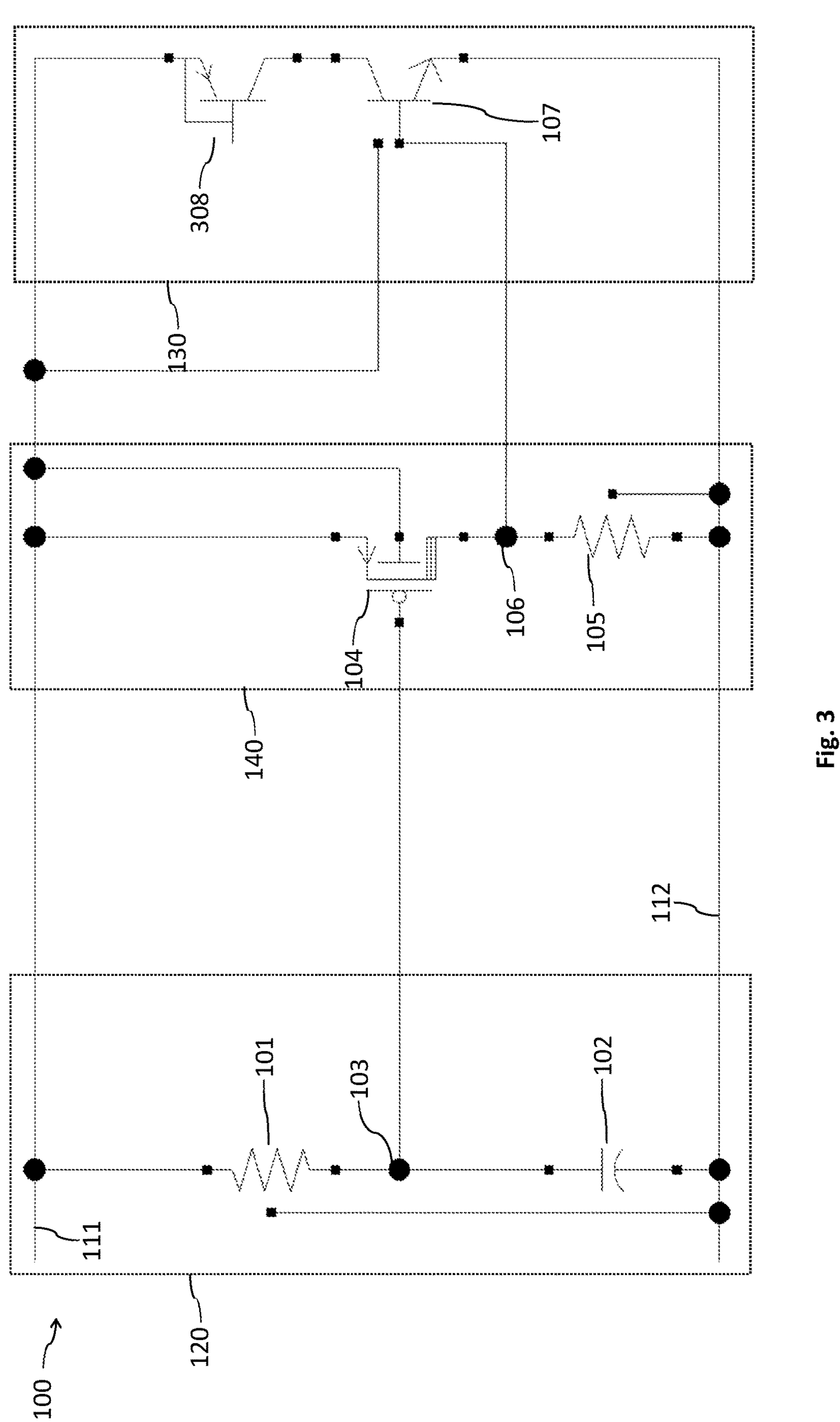
FIG. 3 shows another example ESD protection circuit.
Figure 4:
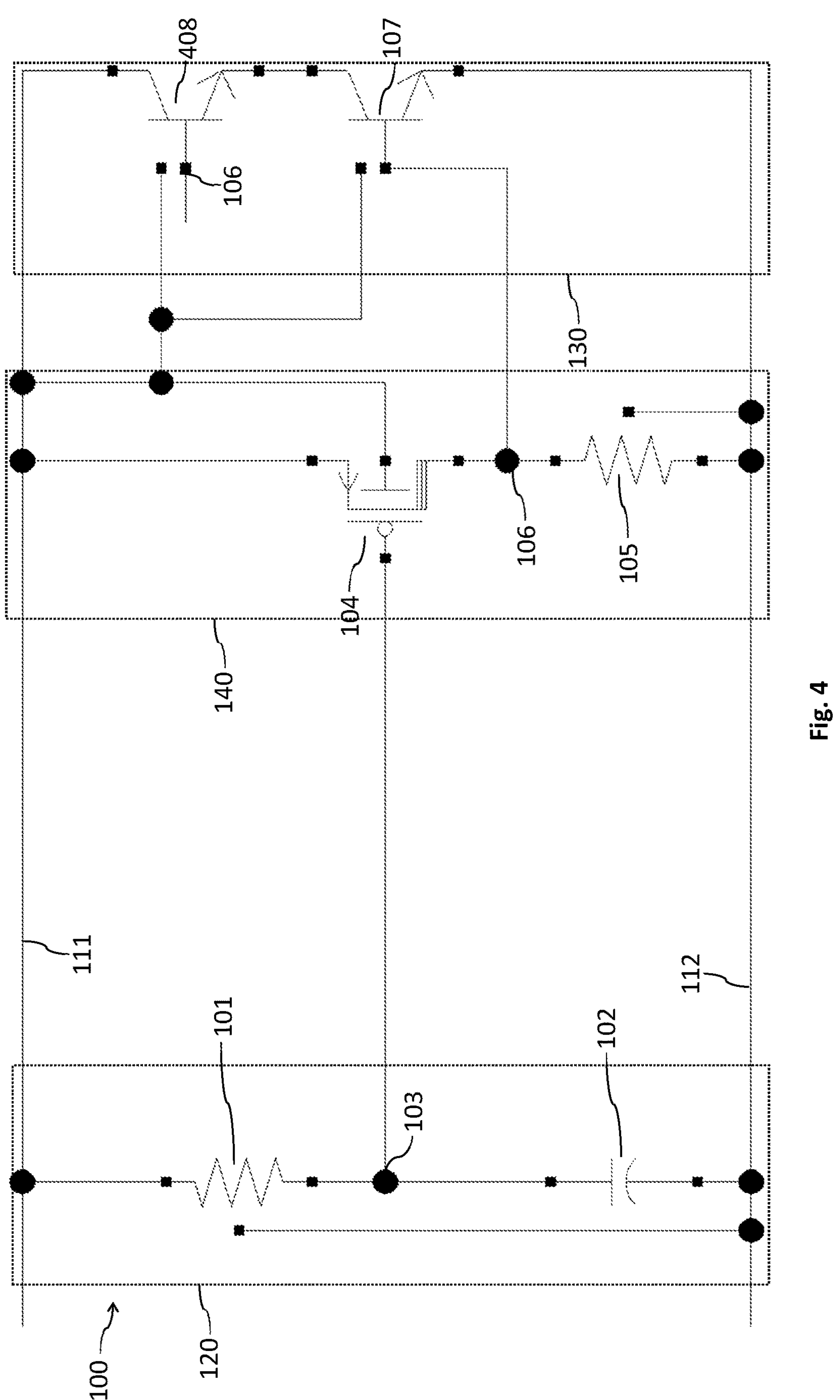
FIG. 4 shows a further example ESD protection circuit.

The bipolar junction transistor 107, which may be referred to as the main BJT, may be arranged in series and/or may be cascoded with another BJT 108, which may be referred to as a cascoded BJT 108. The cascoded BJT 108 may be part of a silicon-controlled rectifier (SCR), as illustrated in FIG. 1. Alternatively, or in addition, another npn BJT 408 may be used, as illustrated in FIG. 4, or a pnp BJT 308 may be used, as illustrated in FIG. 3. By cascoding the main BJT 107 with another BJT 108, 308, 408, the leakage current of the clamp unit 130 may be reduced, thereby increasing the energy efficiency of the ESD protection circuit 100.

The main BJT 107 and possibly the cascoded BJT 108, 308, 408 are controlled in dependence of the signal, in particular the voltage level, at the detection node 103. The control, in particular the triggering, of the main BJT 107 and the cascoded BJT 108, 308, 408 are preferably synchronized, e.g., such that the main BJT 107 and possibly the cascoded BJT 108, 308, 408 are closed substantially at the same time. An inverter unit 140 may be used to generate the control signal for controlling the main BJT 107 and possibly for controlling the cascoded BJT 108, 308, 408, based on the voltage level at the detection node 103. The inverter unit 140 may be configured to provide a control signal that is HIGH, if the voltage level at the detection node 103 is LOW, and a control signal that is LOW, if the voltage level at the detection node 103 is HIGH. In the illustrated example, the inverter unit 140 comprises a PMOS transistor 104 and a resistor 105 which are arranged in series between the (first rail at the) operating potential 111 and the (second rail at the) reference potential 112. The control signal is provided at the mid node 106 between the PMOS transistor 104 and the resistor 105.

In FIG. 1, the main BJT 107 and the cascoded SCR 108 are coupled to the mid node 106, such that the main BJT 107 and the cascoded SCR 108 are closed in dependence of the control signal which is provided at the mid node 106 of the inverter unit 140. The npn BJT 408 of FIG. 4 is also coupled to the mid node 106 of the inverter unit 140, such that the cascoded npn BJT 408 is closed in dependence of the control signal which is provided at the mid node 106 of the inverter unit 140. In the example of FIG. 3, the emitter and the base of the pnp BJT 308 are both coupled to the operating potential 111, thereby causing the cascoded pnp BJT 308 to be closed automatically, subject to the main BJT 107 being closed.

Figure 2:
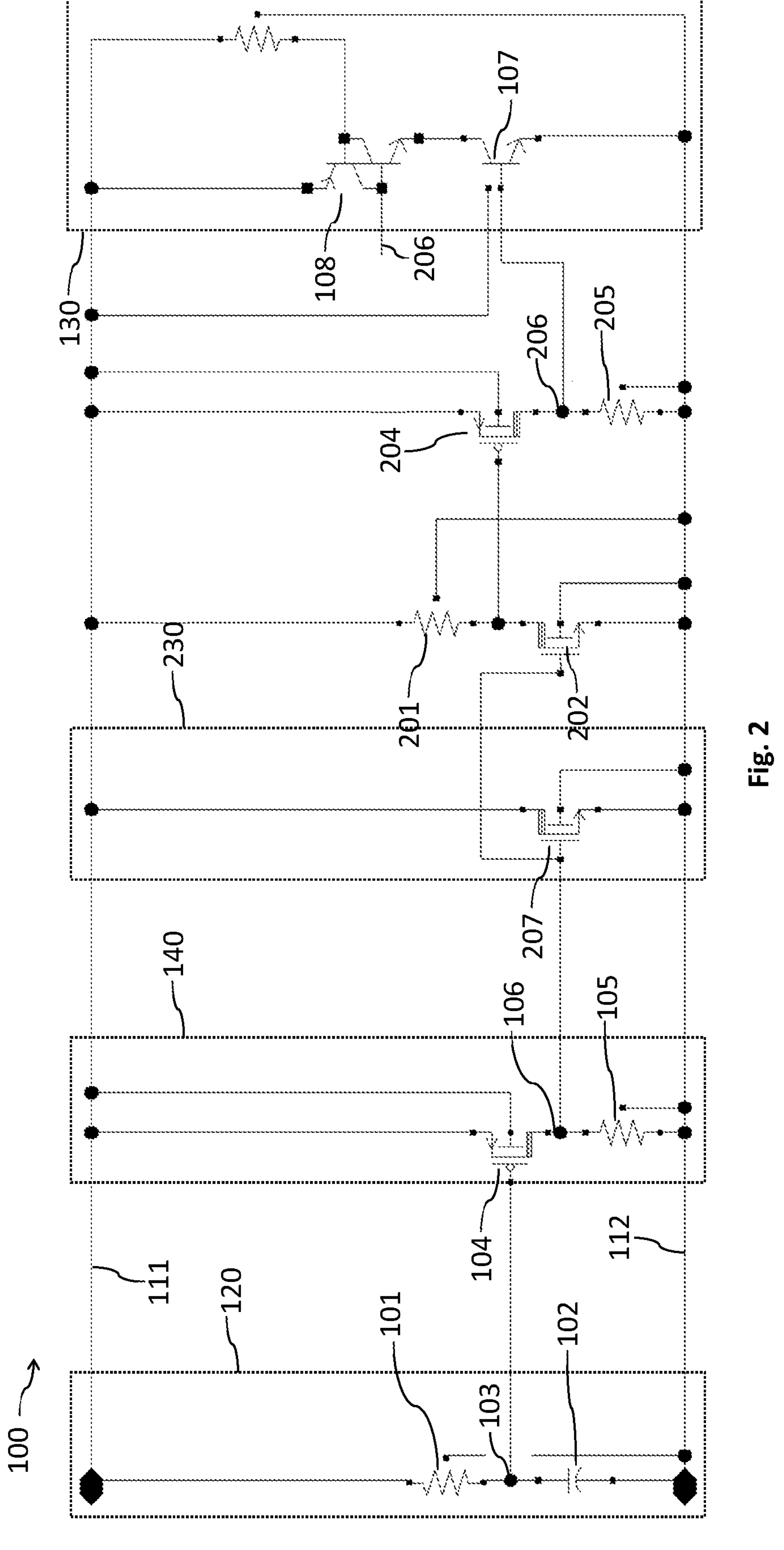
FIG. 2 shows another example ESD protection circuit.

FIG. 2 shows an ESD protection circuit 100 which comprises a MOS (metal oxide semiconductor) based clamp unit 230 in addition to the clamp unit 130 which comprises the bipolar junction transistor 107. The clamp unit 230 comprises an NMOS transistor 207 as a switching element for providing a second discharge path between the (first rail at the) operating potential 111 and the (second rail at the) reference potential 112. The control signal for controlling the NMOS transistor 207 is generated based on the voltage level at the detection node 103 of the detection unit 120, e.g., using the inverter unit 140. In the example shown in FIG. 2, the control signal for controlling the main BJT 107 is generated based on the control signal at the mid node 106 of the inverter unit 140 using two additional inverter units with the resistors 201, 206 and the MOS transistors 202, 204, thereby providing the control signal for controlling the main BJT 107 at the node 206.

In other words, an RC-triggered snapback-based active ESD clamp 100 is described, which incorporates a synchronously triggered NPN transistor 107 cascoded with an SCR 108 or a PNP transistor 308 or an NPN transistor 408, which are used as stacked discharge elements. As a result of this, a footprint-efficient and low leakage ESD protection circuit 100 is provided. The ESD protection circuit 100 exhibits a relatively low trigger voltage and a relatively high holding voltage. The ESD protection circuit 100 may be used for 5.5V+ ESD protection, e.g., in the context of USB applications.

Hence, an ESD protection circuit 100 is described, which is configured to provide ESD protection between a first rail at an operating potential 111 and a second rail at a reference potential 112 (e.g., ground). The operating potential 111 may be between 2V and 6V, e.g., 5V. The ESD protection circuit 100 may be configured to provide ESD protection for an integrated circuit which is operated between the first rail and the second rail.

The ESD protection circuit 100 comprises a detection unit 120 which is configured to detect an ESD event between the first rail and the second rail. The detection unit 120 may comprise a resistor 101 and a capacitor 102, which are arranged in series between the first rail and the second rail. In other words, the detection unit 120 may comprise an RC circuit. A signal, in particular the voltage level, at the detection node 103 between the resistor 101 and the capacitor 102 may be indicative of an ESD event. In particular, an abrupt increase or drop of the voltage level at the detection node 103 may be indicative of an ESD event. The detection unit 120, in particular the RC circuit, may have a pre-determined time constant, wherein the pre-determined time constant may be used for setting the duration of the time interval, during which the discharge path for an ESD event is provided by the ESD protection circuit 100.

Furthermore, the ESD protection circuit 100 comprises a clamp unit 130 which is configured to provide the discharge path between the first rail and the second rail, in reaction to an ESD event which has been detected by the detection unit 120. An electrical charge may be guided through the discharge path from the first rail to the second rail, thereby removing the electrical charge caused by the ESD event and thereby providing the ESD protection. The discharge path is typically only provided temporarily.

The clamp unit 130 comprises a main bipolar junction transistor 107 which is cascoded with an additional bipolar junction transistor 108, 308, 408 for providing the discharge path. The main bipolar junction transistor 107 may be a npn bipolar junction transistor. The main bipolar junction transistor 107 and the additional bipolar junction transistor 108, 308, 408 are preferably operated, notably closed and/or opened, in a synchronized manner for providing and/or for interrupting the discharge path.

By making use of a clamp unit 130 with a main bipolar junction transistor 107 that is cascoded with an additional bipolar junction transistor 108, 308, 408 an area efficient ESD protection circuit 100 with a relatively low leakage current may be provided.

The additional bipolar junction transistor 108, 308, 408 may be part of a silicon-controlled rectifier 108, such that the main bipolar junction transistor 107 is cascoded with the silicon-controlled rectifier 108 for providing the discharge path.

Alternatively, or in addition, the additional bipolar junction transistor 108, 308, 408 may be a pnp bipolar junction transistor 308. The base of the pnp bipolar junction transistor 308 may be directly coupled to the emitter of the pnp bipolar junction transistor 308, thereby causing the pnp bipolar junction transistor 308 to be closed in reaction to the main bipolar junction transistor 107 being closed.

Alternatively, or in addition, the additional bipolar junction transistor 108, 308, 408 may be a npn bipolar junction transistor 408.

The main bipolar junction transistor 107 and the additional bipolar junction transistor 108, 308, 408 may be arranged in series between the first rail at the operating potential 111 and the second rail at the reference potential 112. The main bipolar junction transistor 107, in particular the collector of the main bipolar junction transistor 107, may be directly coupled to the second rail. The additional bipolar junction transistor 108, 308, 408, in particular the emitter of the additional bipolar junction transistor 108, 308, 408, may be directly coupled to the first rail. Furthermore, the additional bipolar junction transistor 108, 308, 408, in particular the collector of the additional bipolar junction transistor 108, 308, 408, may be directly coupled to the main bipolar junction transistor 107, in particular the emitter of the main bipolar junction transistor 107.

The ESD protection circuit 100 may be configured to close the main bipolar junction transistor 107 and the additional bipolar junction transistor 108, 308, 408 (in a synchronized manner) to provide the discharge path, in reaction to an ESD event detected by the detection unit 120. Furthermore, the ESD protection circuit 100 may be configured to open the main bipolar junction transistor 107 and the additional bipolar junction transistor 108, 308, 408 (in a synchronized manner) to interrupt the discharge path, after a certain time duration has lapsed since the time instant of the detection of the ESD event. As a result of this, a particularly efficient and reliable ESD protection may be provided.

As indicated above, the detection unit 120 may be configured such that a signal, in particular the voltage level, at the detection node 103 changes upon occurrence of an ESD event. The ESD protection circuit 100 may be configured to generate the control signal for controlling the main bipolar junction transistor 107 and/or the additional bipolar junction transistor 108, 308, 408 based on the signal, in particular based on the voltage level, at the detection node 103. For this purpose, the ESD protection circuit 100 may comprise an inverter unit 140 which is configured to generate the control signal in dependence of the signal, in particular the voltage level, at the detection node 103. By doing this, a particularly efficient and reliable ESD protection may be provided.

The ESD protection circuit 100 may comprise a second clamp unit 230 which is configured to provide a second discharge path between the first rail and the second rail, in reaction to an ESD event which is detected by the detection unit 120. The second clamp unit 230 may comprise a MOS transistor 207 for providing the second discharge path. Hence, the ESD protection circuit 100 may comprise multiple clamp units 130, 230, thereby further increasing the reliability of ESD protection. Furthermore, the latch-up immunity of the ESD protection circuit 100 may be improved.

The ESD protection circuit 100 may comprise one or more first inverter units for generating the control signal for controlling the main bipolar junction transistor 107 based on the signal at the detection node 103. Furthermore, the ESD protection circuit 100 may comprise a second inverter unit 140 for generating the control signal for controlling the MOS transistor 207 based on the signal at the detection node 103.

The one or more first inverter units may be configured to generate the control signal for controlling the main bipolar junction transistor 107 based on the control signal for controlling the MOS transistor 207, which is provided by the second inverter unit 140. Alternatively, the second inverter unit 140 may be configured to generate the control signal for controlling the MOS transistor 207 based on the control signal for controlling the main bipolar junction transistor 107, which is generated by the one or more first inverter units. As a result of this, the multiple clamp units 130, 230 may be controlled in an efficient and reliable manner.

Furthermore, an integrated circuit comprising circuitry with e.g., one or more MOS transistors is described. The integrated circuit comprises an ESD protection circuit 100 as described in the present document, for protecting the circuitry.

It should be noted that the description and drawings merely illustrate the principles of the proposed systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems.

Furthermore, all statements herein providing principles, aspects, and embodiments of the invention, as well as specific examples thereof, are intended to encompass equivalents thereof.

The invention claimed is:

1. An ESD protection circuit which is configured to provide ESD protection between a first rail at an operating potential and a second rail at a reference potential;

wherein the ESD protection circuit comprises, a detection unit which is configured to detect an ESD event between the first rail and the second rail; and a clamp unit configured to provide a discharge path between the first rail and the second rail, in reaction to an ESD event detected by the detection unit; wherein the clamp unit comprises a main bipolar junction transistor which is cascoded with an additional bipolar junction transistor for providing the discharge path, wherein:

the main bipolar junction transistor and the additional bipolar junction transistor are arranged in series between the first rail at the operating potential and the second rail at the reference potential; and the ESD protection circuit is configured to close the main bipolar junction transistor and the additional bipolar junction transistor in a synchronized manner to provide the discharge path, in reaction to an ESD event detected by the detection unit.

2. The ESD protection circuit of claim 1, wherein the additional bipolar junction transistor is part of a silicon-controlled rectifier, such that the main bipolar junction transistor is cascoded with the silicon-controlled rectifier for providing the discharge path.

3. The ESD protection circuit of claim 1, wherein the additional bipolar junction transistor is a pnp bipolar junction transistor.

4. The ESD protection circuit of claim 3, wherein a base of the pnp bipolar junction transistor is directly coupled to an emitter of the pnp bipolar junction transistor.

5. The ESD protection circuit of claim 1, wherein the additional bipolar junction transistor is a npn bipolar junction transistor.

6. The ESD protection circuit of claim 1, wherein the main bipolar junction transistor is a npn bipolar junction transistor.

7. The ESD protection circuit of claim 1, wherein the detection unit comprises a detection node;

the detection unit is configured such that a signal at the detection node changes upon occurrence of an ESD event; and the ESD protection circuit is configured to generate a control signal for controlling the main bipolar junction transistor and the additional bipolar junction transistor based on the signal at the detection node.

8. The ESD protection circuit of claim 7, wherein the ESD protection circuit comprises an inverter unit which is configured to generate the control signal in dependence of the signal at the detection node.

9. The ESD protection circuit of claim 1, wherein the ESD protection circuit comprises a second clamp unit which is configured to provide a second discharge path between the first rail and the second rail, in reaction to an ESD event detected by the detection unit; and the second clamp unit comprises a MOS transistor for providing the second discharge path.

10. The ESD protection circuit of claim 9, wherein the detection unit is configured to provide a signal indicative of an ESD event at a detection node;

the ESD protection circuit comprises one or more first inverter units for generating a control signal for controlling the main bipolar junction transistor based on the signal at the detection node; and the ESD protection circuit comprises a second inverter unit for generating a control signal for controlling the MOS transistor based on the signal at the detection node.

11. The ESD protection circuit of claim 10, wherein the one or more first inverter units are configured to generate the control signal for controlling the main bipolar junction transistor based on the control signal for controlling the MOS transistor, which is provided by the second inverter unit; or the second inverter unit is configured to generate the control signal for controlling the MOS transistor based on the control signal for controlling the main bipolar junction transistor, which is generated by the one or more first inverter units.

12. The ESD protection circuit of claim 1, wherein the detection unit comprises a resistor and a capacitor, which are arranged in series between the first rail and the second rail; and a signal at a detection node between the resistor and the capacitor is indicative of an ESD event.

13. An integrated circuit comprising circuitry with one or more MOS transistors; and an ESD protection circuit according to claim 1 for protecting the circuitry with the one or more MOS transistors.

* * * * *